(12) United States Patent
Lai et al.

(10) Patent No.: US 9,412,743 B2
(45) Date of Patent: Aug. 9, 2016

(54) COMPLEMENTARY METAL OXIDE SEMICONDUCTOR DEVICE

(71) Applicant: UNITED MICROELECTRONICS CORP., Hsin-Chu (TW)

(72) Inventors: Chien-Ming Lai, Tainan (TW); Chien-Chung Huang, Tainan (TW); Yu-Ting Tseng, Tainan (TW); Ya-Huei Tsai, Tainan (TW); Yu-Ping Wang, Taoyuan County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/526,552

(22) Filed: Oct. 29, 2014

(65) Prior Publication Data
US 2016/0093616 A1    Mar. 31, 2016

(30) Foreign Application Priority Data

Sep. 30, 2014    (CN) .......................... 2014 1 0524514

(51) Int. Cl.
| | | |
|---|---|---|
| *H01L 27/092* | (2006.01) | |
| *H01L 21/28* | (2006.01) | |
| *H01L 21/8238* | (2006.01) | |
| *H01L 29/49* | (2006.01) | |
| *H01L 29/66* | (2006.01) | |
| *H01L 29/51* | (2006.01) | |
| *H01L 29/78* | (2006.01) | |

(52) U.S. Cl.
CPC ...... *H01L 27/0922* (2013.01); *H01L 21/28088* (2013.01); *H01L 21/823842* (2013.01); *H01L 29/4966* (2013.01); *H01L 29/66545* (2013.01); *H01L 29/513* (2013.01); *H01L 29/517* (2013.01); *H01L 29/6656* (2013.01); *H01L 29/6659* (2013.01); *H01L 29/7843* (2013.01)

(58) Field of Classification Search
CPC ..................... H01L 27/0922; H01L 21/28088; H01L 21/823842; H01L 29/4966
See application file for complete search history.

(56) References Cited

U.S. PATENT DOCUMENTS

| | | | | |
|---|---|---|---|---|
| 2012/0028434 | A1* | 2/2012 | Lee .......................... | G02F 7/40 438/400 |
| 2012/0043617 | A1* | 2/2012 | Nakagawa ........ | H01L 21/28088 257/369 |
| 2013/0026579 | A1* | 1/2013 | Lu ........................ | H01L 27/1104 257/369 |
| 2014/0131809 | A1* | 5/2014 | Ando ................ | H01L 21/02697 257/369 |

* cited by examiner

*Primary Examiner* — Bilkis Jahan
(74) *Attorney, Agent, or Firm* — Winston Hsu; Scott Margo

(57) ABSTRACT

The present invention provides a complementary metal oxide semiconductor device, comprising a PMOS and an NMOS. The PMOS has a P type metal gate, which comprises a bottom barrier layer, a P work function metal (PWFM) layer, an N work function tuning (NWFT) layer, an N work function metal (NWFM) layer and a metal layer. The NMOS has an N type metal gate, which comprises the NWFT layer, the NWFM layer and the low-resistance layer. The present invention further provides a method of forming the same.

10 Claims, 5 Drawing Sheets

COMPLEMENTARY METAL OXIDE SEMICONDUCTOR DEVICE

BACKGROUND OF THE INVENTION

1. Field of the Invention

The present invention is related to a complementary metal oxide semiconductor (CMOS) device and a method of forming the same, and more particularly, to a CMOS with an N work function tuning layer and a method of forming the same.

2. Description of the Prior Art

Poly-silicon is conventionally used as a gate electrode in semiconductor devices, such as metal-oxide-semiconductors (MOS). However, with a trend toward scaling down the size of semiconductor devices, the conventional poly-silicon gate faces problems like low performances due to boron penetration, and unavoidable depletion effect that increases the equivalent thickness of the gate dielectric layer, reduces the gate capacitance, and worsens a driving force of the devices. Therefore, work function metals are used to replace the conventional poly-silicon gates as control electrodes that are suitable as high-K gate dielectric layers.

In a complementary metal-oxide semiconductor (CMOS) device, one of the dual work function metal gates is used in an NMOS device and the other one is alternatively used in a PMOS device. It is well-known that the compatibility and the process controls of the dual metal gates are more complicated, whereas the thickness and the composition controls of the materials used in the dual metal gate method are more precise. The conventional dual metal gate methods are categorized into gate first processes and gate last processes. In a conventional dual metal gate method applied with the gate first process, the annealing process for forming the source/drain ultra-shallow junction and the silicide process are performed after forming the metal gate. In the conventional gate last process, a sacrificial gate or a replacement gate is provided in a first step, followed by performing processes used to construct a normal MOS transistor. Then, the sacrificial/replacement gate is removed to form a gate trench. Consequently, the gate trench is filled with metals according to the different electrical requirements. However, because of the complicated steps of the gate last processes, the manufacturers are devoted to simplifying the manufacturing process.

In the gate first process or the gate last process, the metal gate of the PMOS or the NMOS may include a plurality of metal layers. The materials of the metal layers always affect the work function of the NMOS or the PMOS, and consequently affect the performances of the product. Thus, the manufacturers are searching for new manufacturing method to obtain a MOS with better work function performances.

SUMMARY OF THE INVENTION

The present invention therefore provides a method of forming a semiconductor device with a metal gate, which has good electrical performance.

According to one embodiment, the present invention provides a complementary metal oxide semiconductor device, comprising a PMOS and an NMOS. The PMOS has a P type metal gate, which comprises a bottom barrier layer, a P work function metal (PWFM) layer, an N work function tuning (NWFT) layer, an N work function metal (NWFM) layer and a metal layer. The NMOS has an N type metal gate, which comprises the NWFT layer, the NWFM layer and the low-resistance layer.

According to another embodiment, the present invention further provides a method of forming a CMOS. A dielectric layer having a first trench and a second trench is provided, and a bottom barrier layer and a P work function metal (PWFM) layer are formed in the first trench and the second trench. Next, the bottom barrier layer and the PWFM layer are removed from the second trench. After forming an N work function tuning (NWFT) layer and an N work function metal (NWFM) layer in the first trench and the second trench, a metal layer is formed to completely fill the first trench and the second trench.

The present invention specifically considers the electrical requirement of NMOS. As such, the bottom barrier layer and PWFM layer are removed from the second trench and the NWFM layer and the NWFT layer are formed therein, thereby obtaining a NMOS with good electrical performance.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
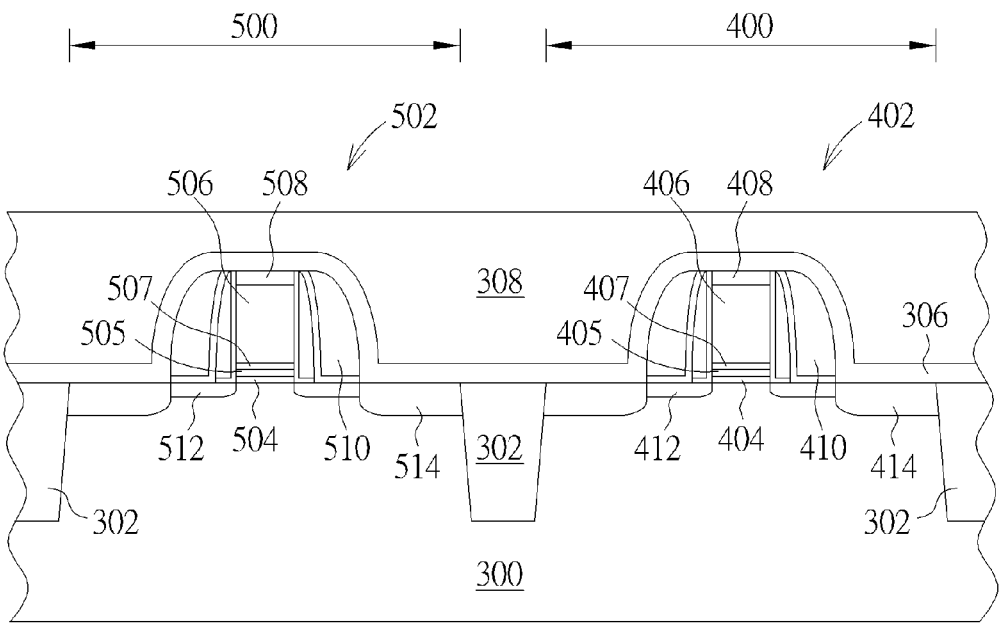
FIG. 1 to FIG. 10 are schematic diagrams of the method of forming a CMOS according to one embodiment of the present invention.

To provide a better understanding of the present invention, preferred embodiments will be described in detail. The preferred embodiments of the present invention are illustrated in the accompanying drawings with numbered elements.

Please refer to FIG. 1 to FIG. 10. FIGS. 1 to 10 are schematic diagrams of the method for fabricating a CMOS device according to one embodiment of the present invention. First, a substrate 300 is provided, such as a silicon substrate, a silicon-containing substrate or a silicon-on-insulator (SOI) substrate. A plurality of shallow trench isolations (STI) 302 is disposed on the substrate 300. According to the areas encompassed by the STI 302, a first active region 400 and a second active region 500, which are insulated from each other, are defined on the substrate 300. Then, a first conductive type transistor 402 and a second conductive type transistor 502 are formed on the substrate 300 in the first active region 400 and the second active region 500 respectively. In one preferred embodiment of the present invention, the first conductive type transistor 402 is a P-type transistor, while the second conductive type transistor 502 is an N-type transistor.

In one embodiment shown in FIG. 1, the first conductive type transistor 402 includes a first interface layer 404, a first high-k dielectric layer 405, a first etch stop layer 407, a first sacrificial gate 406, a first cap layer 408, a first spacer 410, a first lightly doped drain (LDD) 412 and a first source/drain 414. In one preferred embodiment of the present invention, the first interface layer 404 can be a $SiO_2$ layer. The high-k gate dielectric layer 405 has a dielectric constant greater than 4, and the material thereof includes rare earth metal oxides or lanthanide oxides, such as hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), lanthanum aluminum oxide (LaAlO), tantalum oxide ($Ta_2O_5$), zirconium oxide ($ZrO_2$), zirconium silicon oxide ($ZrSiO_4$), hafnium zirconium oxide (HfZrO), yttrium oxide ($Yb_2O_3$), yttrium silicon oxide (YbSiO), zirconium aluminate (ZrAlO), hafniumaluminate (HfAlO), aluminum nitride (AlN), titanium oxide ($TiO_2$), zirconium oxynitride (ZrON), hafnium oxynitride (HfON), zirconium silicon oxynitride (ZrSiON), hafnium silicon oxynitride (HfSiON), strontium bismuth tantalite (SrBi$_2$Ta$_2$O$_9$, SBT), lead zirconate titanate (PbZr$_x$Ti$_{1-x}$O$_3$, PZT) or barium strontium titanate (Ba$_x$Sr$_{1-x}$TiO$_3$, BST), but is not limited thereto. The first etch stop layer 407 includes metal/metal nitride, such as TiN. The first sacrificial gate 406 is a poly-silicon gate. In another embodiment, the first sacrificial gate 406 is a multi-layered gate including a poly-silicon layer, an amorphous silicon layer or a germanium layer. The first cap layer 408 is a SiN layer for example. The first spacer 410 can be a multi-layered structure including high temperature oxide (HTO), SiN, SiO or SiN formed by hexachlorodisilane (Si$_2$Cl$_6$) (HCD-SiN). The first LDD 412 and the first source/drain 414 are formed by appropriate dopants implantation.

The second conductive type transistor 502 includes a second interface layer 504, a second high-k dielectric layer 505, a second etch stop layer 507, a second sacrificial gate 506, a second cap layer 508, a second spacer 510, a second LDD 512 and a second source/drain 514. The components in the second conductive type transistor 502 of this embodiment are similar to those of the first conductive type transistor 402 and are therefore not described repeatedly. In addition, the first conductive type transistor 402 and the second conductive type transistor 502 can further include other semiconductor structures that are not explicitly shown in FIG. 1, such as a silicide layer, a source/drain having an hexagon (also called sigma Σ) or an octagon shaped cross-section which is formed by selective epitaxial growth (SEG), or other protective films. After forming the first conductive type transistor 402 and the second conductive type transistor 502, a contact etch stop layer (CESL) 306 and an inter-layer dielectric (ILD) layer 308 are formed on the substrate 300 to cover the first conductive type transistor 402 and the second conductive type transistor 502. In one embodiment, the CESL 306 can generate a stress to forma selective strain scheme (SSS) wherein a compressing force is applied on the first conductive type electrode 402 and a straining force is applied on the second conductive type electrode 502.

Figure 2:
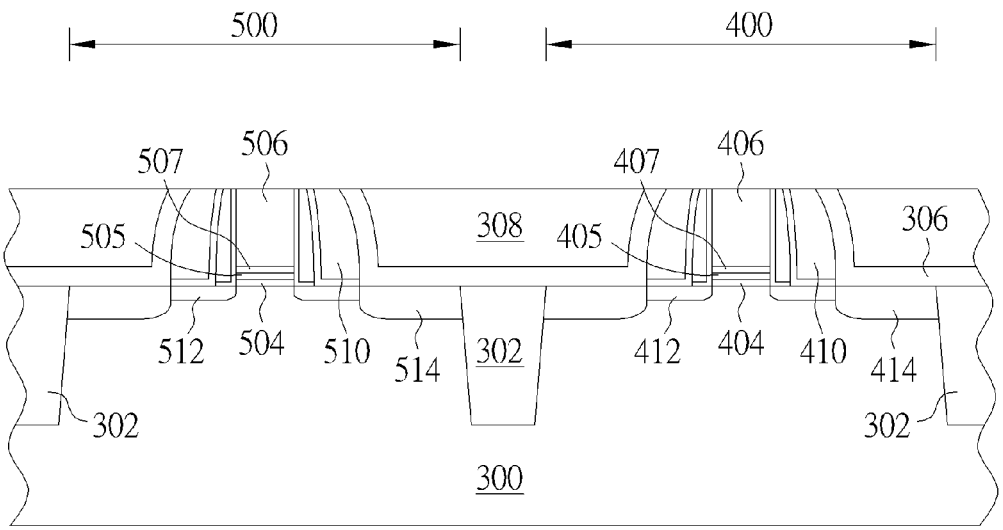

As shown in FIG. 2, a planarization process, such as a chemical mechanical polish (CMP) process or an etching-back process or combination thereof is performed to remove a part of the ILD layer 308, a part of the CESL 306, a part of the first spacer 410, a part of the second spacer 510, and completely remove the first cap layer 408 and the second cap layer 508, until the top surfaces of the first sacrificial gate 406 and the second sacrificial gate 506 are exposed.

Figure 3:
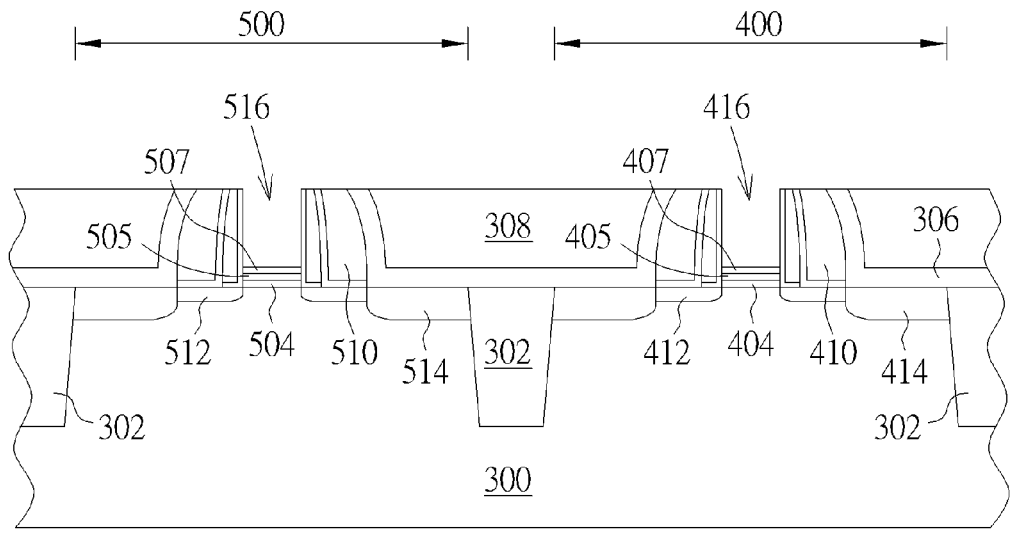

As shown in FIG. 3, a wet etching process and/or a dry etching process is performed to remove the first sacrificial gate 406 and the second sacrificial gate 506 until exposing the first etch stop layer 407 and the second etch stop layer 507. In this step, the etching process preferably stops on the first etch stop layer 407 and the second etch stop layer 507. A first trench 416 is therefore formed in the first conductive type transistor 402 and a second trench 516 is formed in the second conductive type transistor 502.

Figure 4:
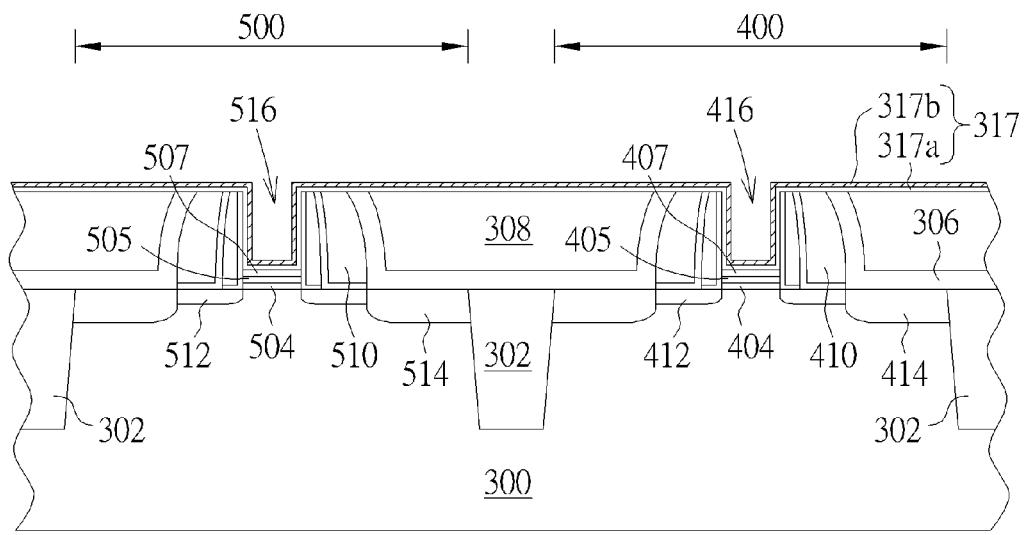

As shown in FIG. 4, a bottom barrier layer 317 is formed comprehensively on the substrate 300 and along the surface of the first trench 416 and the second trench 516, but the first trench 416 and the second trench 516 are not completely filled with the bottom barrier layer 317. The bottom barrier layer 317 can be one single layer or be composed of multi layers. In one preferred embodiment, the bottom barrier layer 317 comprises a first bottom barrier layer 317a and a second bottom barrier layer 317b disposed thereon, wherein the material thereof comprises metal or metal nitride. For instance, the first bottom barrier layer 317a is TaN and the second bottom barrier layer is TiN. In one preferred embodiment, the bottom barrier layer 317, especially the first bottom barrier layer 317a has an etching selectivity with respect to the second etch stop layer 507.

Figure 5:
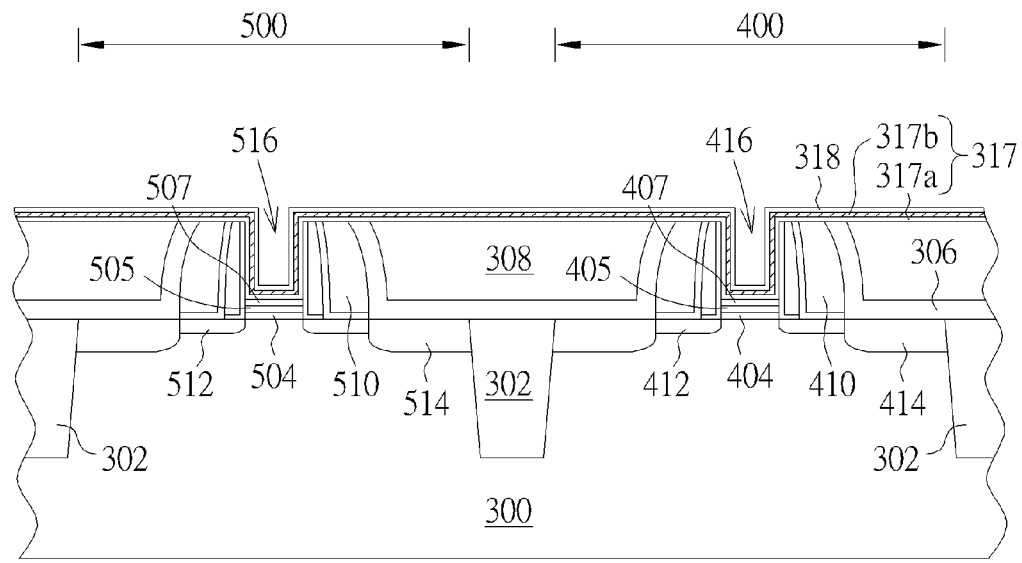

As shown in FIG. 5, a P work function metal (PWFM) layer 318 is formed on the bottom barrier layer 317 in the first trench 416 and the second trench 516. In the present embodiment, the P type work function metal layer 318 serves as a work function metal required in a P-type transistor and includes Ni, Pd, Pt, Be, Ir, Te, Re, Ru, Rh, W, Mo, or WN, RuN, MoN, TiN, TaN, or WC, TaC, TiC, or TiAlN, TaAlN, but should not be limited thereto.

Figure 6:
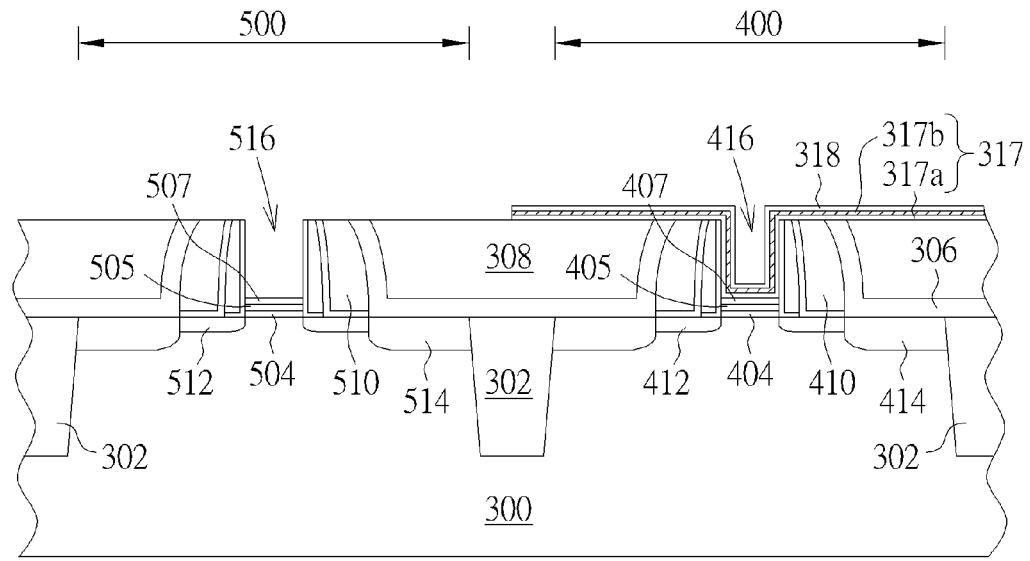

As shown in FIG. 6, the PWFM layer 318, the bottom barrier layer 317 (including the first bottom barrier layer 317a and/or the second bottom barrier layer 317b) in the second active region 500 (especially the second trench 516) are removed away. Since the bottom barrier layer 317 has an etching selectivity with respect to the second etch stop layer 507, the removing step preferably does not affect the below second high-k dielectric layer 505.

Figure 7:
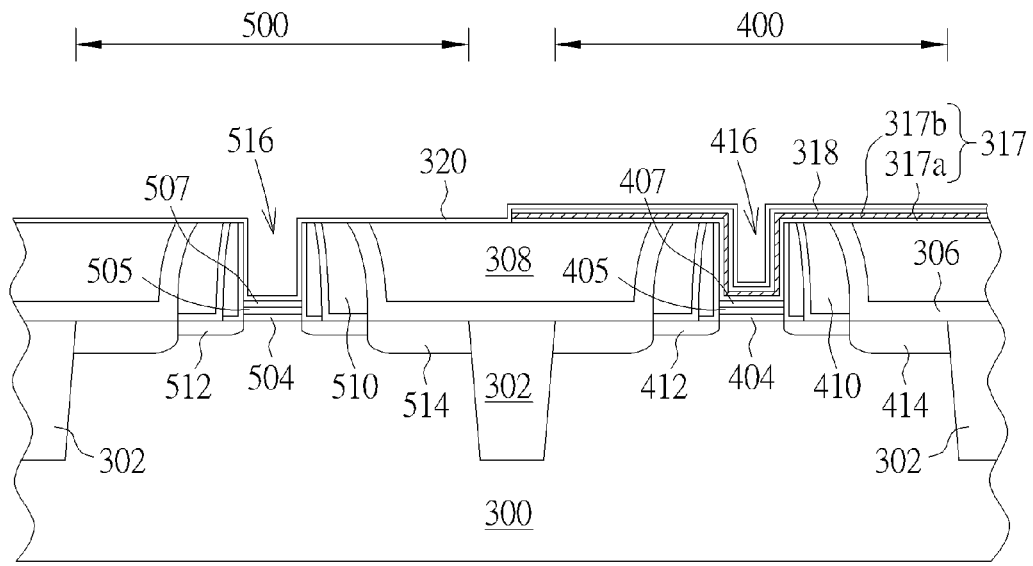

As shown in FIG. 7, an N type work function tuning (NWFT) layer 320 is formed on the substrate 300. The NWFT layer 320 is formed on a surface of the PWFM layer 318 in the first active region 400 and a surface of the second trench 516 and the second etch stop layer 507 in the second active region 500, but the first trench 416 and the second trench 516 are not completely filled with the NWFT layer 320. In one embodiment, the NWFT layer 320 has a material suitable for tuning the N type work function metal layer, such as TiN or TaN. In one embodiment, a concentration of nitrogen in the NWFT 320 is greater than a concentration of titanium in the NWFT layer ("N-rich"). Alternatively, the concentration of nitrogen in the NWFT 320 is less than a concentration of titanium in the NWFT layer ("Ti-rich"). When the NWFT layer 320 is N-rich, the forming method thereof can include forming a TiN layer or a TaN layer, followed by a nitridation treatment. In one embodiment, a mask can be formed for covering the first active region 400, so only the NWFT layer 320 in the second active region 500 is subjected to the nitridation treatment. In another embodiment, after the nitridation treatment, the NWFT layer 320 in the first active region 400 can be removed. It is noted that the method of the present invention removes bottom barrier layer 317 and the PWFM layer 318 in the second trench 516 and further forms the NWFT layer 320 in order to provide better performance for the NMOS.

Figure 8:
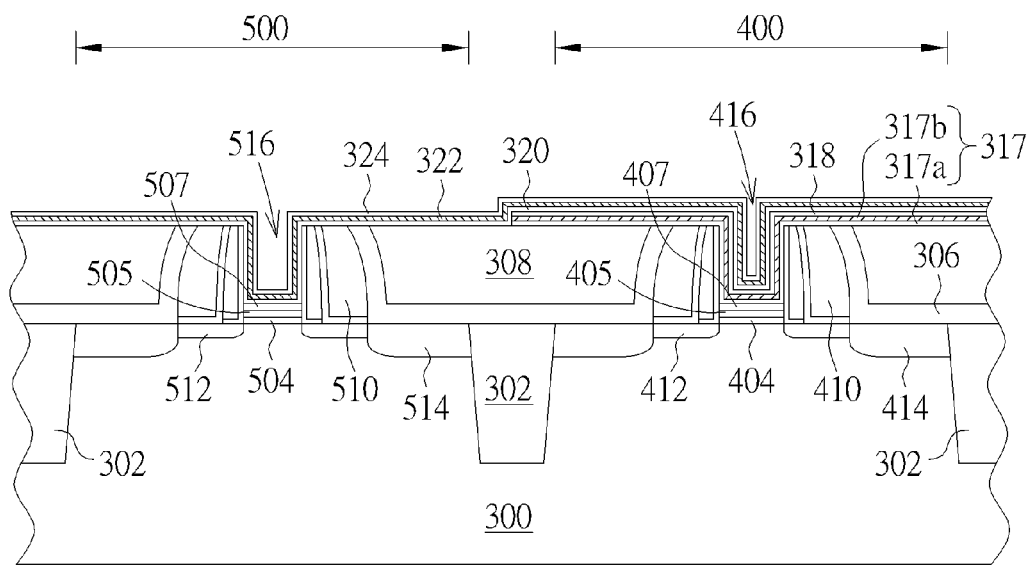

As shown in FIG. 8, an N type work function metal (NWFM) layer 322 is formed on the substrate 300, filling into the first trench 416 and the second trench 516 to cover the NWFT layer 320. In one preferred embodiment of the present invention, the N type work function metal layer 322 serves as a work function metal required by an N-type transistor and includes titanium aluminides (TiAl), aluminum zirconium (ZrAl), aluminum tungsten (WAl), aluminum tantalum (TaAl) or aluminum hafnium (HfAl), but should not be limited thereto. Subsequently, an optional top barrier layer 324 is formed on the NWFM layer 322, such as TiN, TiAlC, TiAlN, TaN, TaAlC, TaAlN, TiCu, TiCuN, TaCuC, TaCuN, but is not limited thereto.

Figure 9:
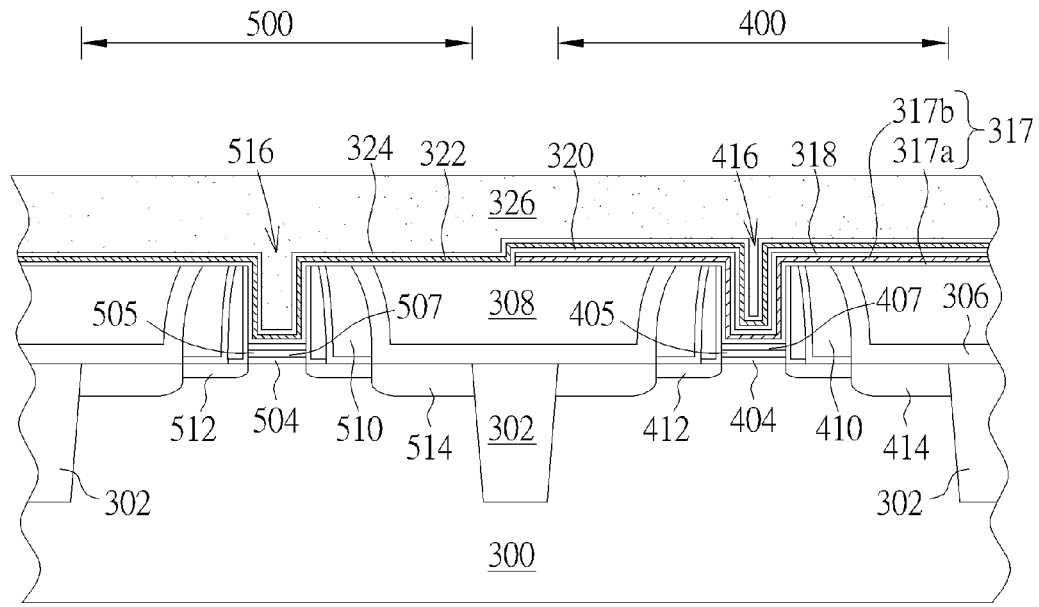

As shown in FIG. 9, a low resistive metal layer 326 is formed on the substrate 300. The metal layer 326 is formed on the top barrier layer 324 and completely fills the first trench 416 and the second trench 516. The metal layer 326 includes Al, Ti, Ta, W, Nb, Mo, TiN, TiC, TaN, Ti/W or Ti/TiN, but is not limited thereto.

Figure 10:
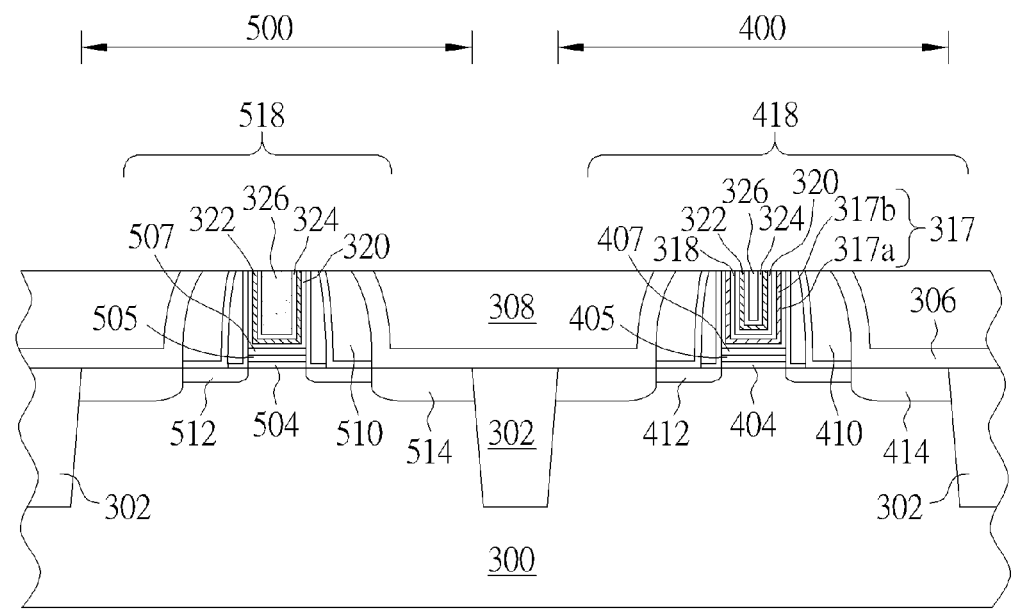

As shown in FIG. 10, a planarization process is performed to simultaneously remove the metal layer 326, the top barrier layer 324, the NWFM layer 322, the NWFT layer 320, the PWFM layer 318, the bottom barrier layer 317 outside of the first trench 416 and the second trench 516. Thus, the first etch stop layer 407, the bottom barrier layer 317, the PWFM layer 318, the NWFT layer 320, the NWFM layer 322, the top barrier layer 324 and the bulk metal layer 326 together form a first metal gate 418 of the first conductive type transistor 402 (P-type transistor), which has a work function substantially between 4.8 eV and 5.2 eV. The second etch stop layer 507, the NWFT layer 320, the NWFM layer 322, the top barrier layer 323 and the bulk metal layer 326 in the second trench 516 together form a second metal gate 518 of the second conductive type transistor 502 (N-type transistor) which has a work function substantially between 3.9 eV and 4.3 eV.

It should be noted that the above method shown in a gate-last process can also be applied in a gate-first process. Besides, the above methods present forming the high-k gate dielectric layer in a first step (namely, the high-K first process). However, those skilled in the art can realize that, in the present invention, it is also possible to form the high-k dielectric layer 405 after removing the sacrificial gate (namely, the high-K last process). For example, a high-K layer can be formed on the surface of the first trench 416 before forming the bottom barrier layer 317 and the PWFM 318. Subsequently, the bottom barrier layer 317 is formed on the high-K dielectric layer in the first trench 416 and the second trench 516. In this embodiment, the high-K gate dielectric layer has a U-shape in their cross section. In another embodiment, the first conductive type transistor 402 and the second conductive type transistor 502 can be non-planar transistors such as Fin-FET and is not limited to the planar transistor application shown above.

In summary, the present invention provides a CMOS device and a method of forming the same. The present invention specifically considers the electrical requirement of NMOS, so the bottom barrier layer and PWFM layer are removed away from the second trench and the NWFM layer and the NWFT layer are formed therein, thereby obtaining a NMOS with good electrical performance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A complementary metal oxide semiconductor (CMOS) device, comprising:
   a PMOS with a P type metal gate, which comprises a bottom barrier layer, a P work function metal (PWFM) layer, an N work function tuning (NWFT) layer, an N work function metal (NWFM) layer and a metal layer; and
   an NMOS with an N type metal gate, which comprises the NWFT layer, the NWFM layer and the metal layer, wherein the P type metal gate and the N type metal gate further comprise a top barrier layer disposed between the NWFM layer and the metal layer, and the NWFM layer is disposed between the NWFT layer and the top barrier layer and has a different material from materials of the NWFT layer and the top barrier layer.

2. The CMOS device according to claim 1, wherein the P type metal gate sequentially comprises the bottom barrier layer, the PWFM layer, the NWFT layer, the NWFM layer and the metal layer.

3. The CMOS device according to claim 1, wherein the N type metal gate sequentially comprises the NWFT layer, the NWFM layer and the metal layer.

4. The CMOS device according to claim 1, wherein the N type metal gate does not comprises the bottom barrier layer and the PWFM layer.

5. The CMOS device according to claim 1, wherein the NWFT layer comprises TiN or TaN.

6. The CMOS device according to claim 5, wherein a concentration of nitrogen is greater than a concentration of titanium in the NWFT layer.

7. The CMOS device according to claim 5, wherein a concentration of nitrogen is less than a concentration of titanium in the NWFT layer.

8. The CMOS device according to claim 1, wherein the bottom barrier layer comprises a first bottom barrier layer and the second bottom barrier layer.

9. The CMOS device according to claim 8, wherein the first bottom barrier layer comprises TiN and the second bottom barrier layer comprises TaN.

10. The CMOS device according to claim 1, wherein the N type metal gate comprises an etch stop layer, and the NWFT layer is disposed between the etch stop layer and the NWFM layer, and the etch stop layer has an etching selectivity with respect to the NWFT layer.

* * * * *